(12) United States Patent
Lee

(10) Patent No.: US 6,337,599 B2
(45) Date of Patent: Jan. 8, 2002

(54) PREDISTORTION LINEARIZER FOR POWER AMPLIFIER

(75) Inventor: Jae Hyuk Lee, Seoul (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 09/750,908

(22) Filed: Jan. 2, 2001

(30) Foreign Application Priority Data

Dec. 30, 1999 (KR) .................................. 99-67170

(51) Int. Cl.[7] .................................................. H03F 1/26
(52) U.S. Cl. ...................................... 330/149; 375/297
(58) Field of Search ................................. 330/149, 136, 330/2; 375/297, 296

(56) References Cited

U.S. PATENT DOCUMENTS

| | | | | |
|---|---|---|---|---|
| 5,365,187 A | * | 11/1994 | Hornak et al. | 330/149 |
| 5,742,201 A | * | 4/1998 | Eisenberg et al. | 330/149 |
| 5,760,646 A | * | 6/1998 | Belcher et al. | 330/149 |
| 5,768,694 A | * | 6/1998 | Kumagai | 455/126 |
| 5,929,704 A | * | 7/1999 | Proctor, Jr. et al. | 330/149 |
| 5,963,087 A | * | 10/1999 | Anderson | 330/136 |
| 6,075,411 A | * | 6/2000 | Briffa et al. | 330/149 |

* cited by examiner

*Primary Examiner*—Robert Pascal
*Assistant Examiner*—Khanh Van Nguyen
(74) *Attorney, Agent, or Firm*—Fleshner & Kim, LLP

(57) ABSTRACT

The present invention relates to a predistortion linearizer for a power amplifier which is capable of improving nonlinear character of a high power amplifier. The predistortion linearizer for the power amplifier includes first and second envelope detectors, which separately detect an envelope of input signals and output signals, respectively, a DSP, which adjusts a tally of a work function by comparing the output signals of the first and the second envelope detector, and a work function generator, which generates a work function from an envelope of input signals to output gain and phase control voltage in accordance with work function tally inputted from the DSP. It also includes a vector modulator, which pre-distorts the input signal in accordance with the control voltages inputted from the work function generator to output a distortion compensation signal to the power amplifier.

32 Claims, 2 Drawing Sheets

PREDISTORTION LINEARIZER FOR POWER AMPLIFIER

BACKGROUND OF THE INVENTION

1. Field of the Invention

The present invention relates to a high power amplifier, in particular to a predistortion linearizer for a high power amplifier that is capable of improving a nonlinear character of a high power amplifier.

2. Background of the Related Art

In general, a high power amplifier is used to increase a power of an input RF signal, and an ideal high power amplifier increases size of the input RF signal without distorting it.

Because the high power amplifier comprises active elements having nonlinear characteristics, however, distortion components are inevitably included in the output of the high power amplifier.

There have been many linearization technologies and algorithms developed to improve the nonlinear characteristics issues of high power amplifiers. Among them, a predistortion method, an envelope feedback method, and a feedforward method are well-known.

Recently the predistortion method has been widely used in mobile communication base stations because its structure is simple, and its efficiency is superior as compared to the feedforward method. Additionally, unlike the envelope feedback method, the predistortion method has no limit on bandwidth.

The basic principle of the predistortion method is to improve the linearity of a high power amplifier by distorting an input signal in advance contrary to nonlinear distortion character of the high power amplifier, and providing the predistorted signal to the power amplifier as an input. Thus, the amplifiers distortion neutralizes the predistortion, leaving an undistorted amplified signal.

FIG. 1 illustrates a related art predistortion linearizer for a high power amplifier.

As shown in FIG. 1, the related art predistortion linearizer comprises a first directional coupler 1, which samples some of an input signal, a phase shifter 2, which changes a phase of the input signal, and a variable attenuator 3, which changes a gain of the input signal. The related art device also includes a power amplifier 4, which amplifies an output of the variable attenuator 3, and a second directional coupler 5, which samples the output of the power amplifier. Finally, a comparison unit 6 is provided to control the phase shifter 2 and the variable attenuator 3 by comparing the output of the first and second directional couplers 1, 5.

An operation of the related art predistortion linearizer for the power amplifier will now be described.

The power amplifier 4 has nonlinear characteristics. In other words, its gain decreases and its phase is delayed in accordance with an increase of an input signal. Accordingly the nonlinear character of the power amplifier 4 can be improved by changing an input signal, so as to be an inverse of the gain decrease and phase change of the power amplifier 4. This is done using the phase shifter 2 and the variable attenuator 3.

When the phase shifter 2 and the variable attenuator 3 operate normally and the sampling rate is adjusted, signals outputted from the first and second directional coupler 1, 5 are equivalent. Herein, the sampling rate is determined so as to make both signals equivalent, and the sampling is performed in accordance with the output signal of the power amplifier 4.

The related art predistortion linearizer has various problems. For example, most of the related art phase shifters and variable attenuators are fabricated using FETs or diodes, and it is very difficult to fashion the nonlinear characteristics of the FET or diode to be accurately inverse to nonlinear characteristics of the power amplifier.

Accordingly, a difference of the signals outputted from the first and second directional coupler 1, 5, namely, the error value, is measured by the comparison unit 6, which includes an OP amp. Thus the phase shifter 2 and the variable attenuator 3 are controlled in accordance with the measured error value, and the nonlinear characteristics of the power amplifier 4 are compensated.

Using this method, however, the related art predistortion linearizer of the power amplifier cannot properly compensate when the nonlinear characteristics of the power amplifier change in accordance with time or external circumstances. Accordingly, the linearity of the power amplifier is reduced and remains uncompensated.

Specifically, as recited above, the phase shifter and the variable attenuator of the related art predistortion linearizer are diodes, and the comparison unit comprises OP-amps. As such, these analog circuits are greatly influenced by external circumstances (such as temperature and noise), and their accuracy is thus lower than a digital circuit.

In addition, an analog circuit can not accurately transmit a control voltage, and can not follow a response speed when the bandwidth of an input signal is wide. Accordingly, the linearity of the power amplifier lowers.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a predistortion linearizer for a power amplifier, which substantially obviates problems due to limitations and disadvantages of the related art.

Another object of the present invention is to provide a predistortion linearizer for a power amplifier, which is capable of improving nonlinear character of the power amplifier quickly and accurately.

Another object of the present invention is to provide a predistortion linearizer for a power amplifier, which can maintain the linearity of the power amplifier when the nonlinear characteristics of the power amplifier change in accordance with external circumstances.

To achieve at least the above objects, in whole or in part, there is provided a predistortion linearizer for a power amplifier having a first and a second envelope detector which separately detect an envelope of input signals and output signals, a DSP which adjusts tally of a work function by comparing output signals of the first and the second envelope detectors, a work function generator, which generates a work function from the envelope of input signals and outputs gain and phase control voltages in accordance with the work function tally inputted from the DSP, and a vector modulator, which distorts input signals in accordance with the control voltage inputted from the work function generator and outputs the distortion compensation signal to the power amplifier.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3 1s a circuit diagram of a DSP of FIG. 2.

DETAILED DESCRIPTION OF PREFERRED EMBODIMENTS

The preferred embodiment of a predistortion linearizer for a power amplifier of the present invention will now be described with reference to accompanying drawings.

Figure 1:
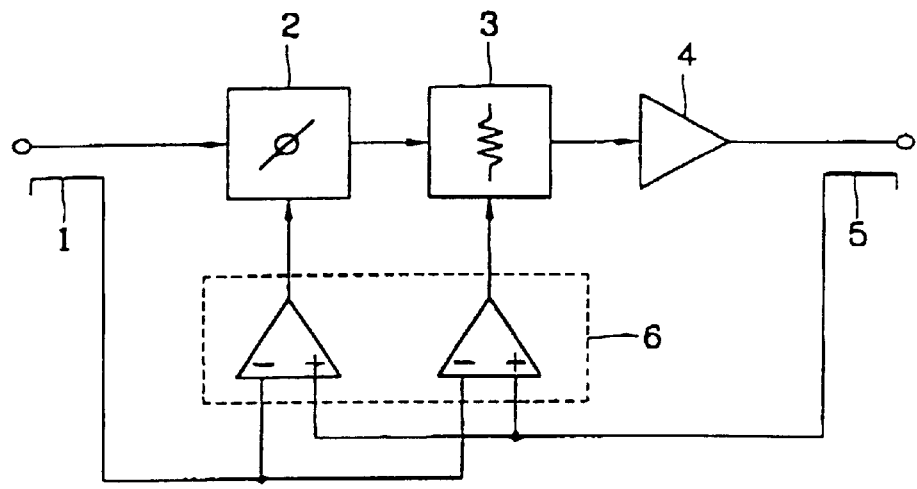
FIG. 1 is a circuit diagram of a related art predistortion linearizer for a power amplifier.
Figure 2:
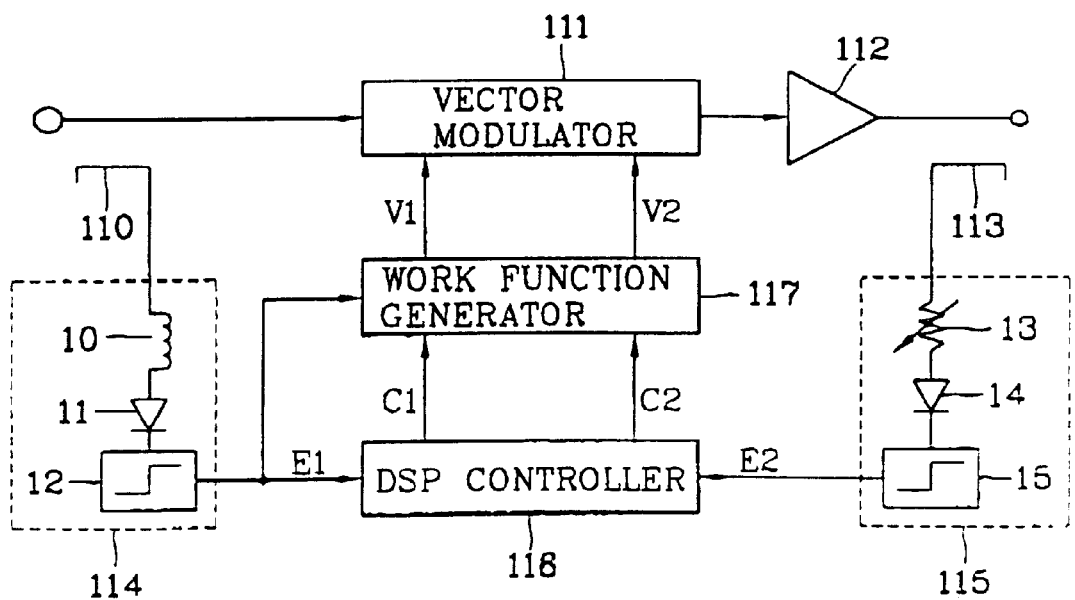
FIG. 2 is a circuit diagram of a predistortion linearizer for a power amplifier according to a preferred embodiment of the present invention.

Referring to FIG. 2, the predistortion linearizer preferably includes a first directional coupler 110, which extracts input signals, a vector modulator 111, which changes gain and phase of the extracted input signals, and a high power amplifier 112, which amplifies the output of the vector modulator 111. The predistortion linearizer also preferably includes a second directional coupler 113, which extracts output signals, and first and second envelope detector circuits 114, 115, which separately detect envelopes of the input and output signals, respectively. Next, a digital signal processor (DSP) 116 preferably compares the extracted envelope signals E1, E2, and outputs tally signals C1, C2 of a work function, and a work function generator 117 generates control voltages V1, V2 to control the gain and phase of the vector modulator 111. Thus the gain and phase are controlled according to the output of the first envelope detector 114 and the tally C1, C2.

The first envelope detector circuit 114 preferably includes a delay unit 10, which delays the input signals for a prescribed period of time, an envelope detector 11, which detects the envelope of the delayed input signals, and low-pass filter 12, which detects low frequency elements of the detected envelope signal to output a first extracted envelope signal E1.

The second envelope detector circuit 115 preferably includes a variable attenuator 13, which adjusts a size (gain) of an output signal to be the same as the size of an input signal, an envelope detector 14, which detects the envelope of the adjusted output signal, and a low-pass filter 15, which detects low frequency elements of the detected envelope.

Figure 3:
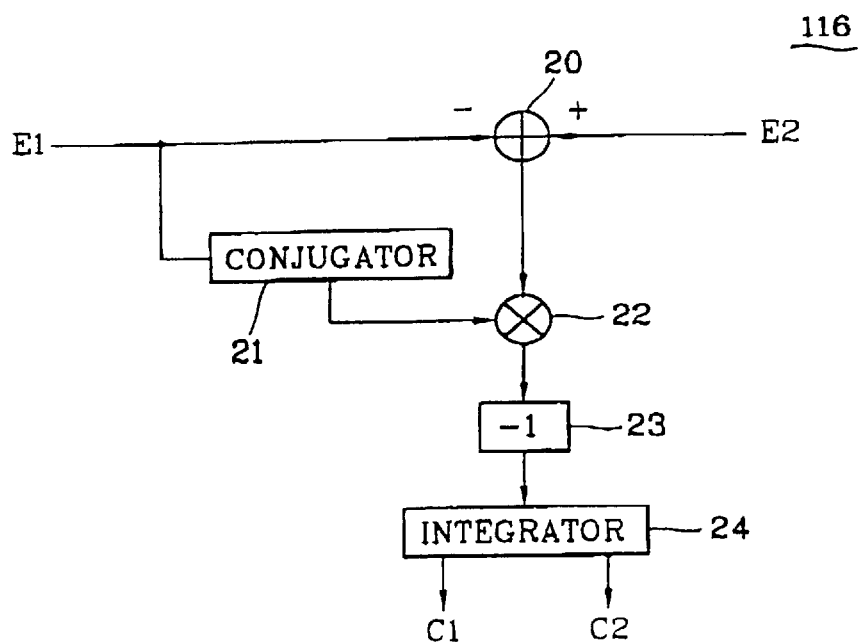

As shown in FIG. 3, the DSP 116 preferably includes a subtracter 20, which subtracts the envelope signals E1, E2 detected by the first and the second envelope detector circuits 114, 115, and a conjugator 21, which changes a code of an imaginary number part of the first envelope signal E1 detected by the first envelope detector circuit 114. A multiplier 22 preferably multiplies the output of the subtracter 20 by the output of the conjugator 21, and an inverter 23 reverses an output signal of the multiplier 22. Finally, an integrator 24 integrates the output of the inverter 23 to provide tally signals C1, C2.

Figure 4:
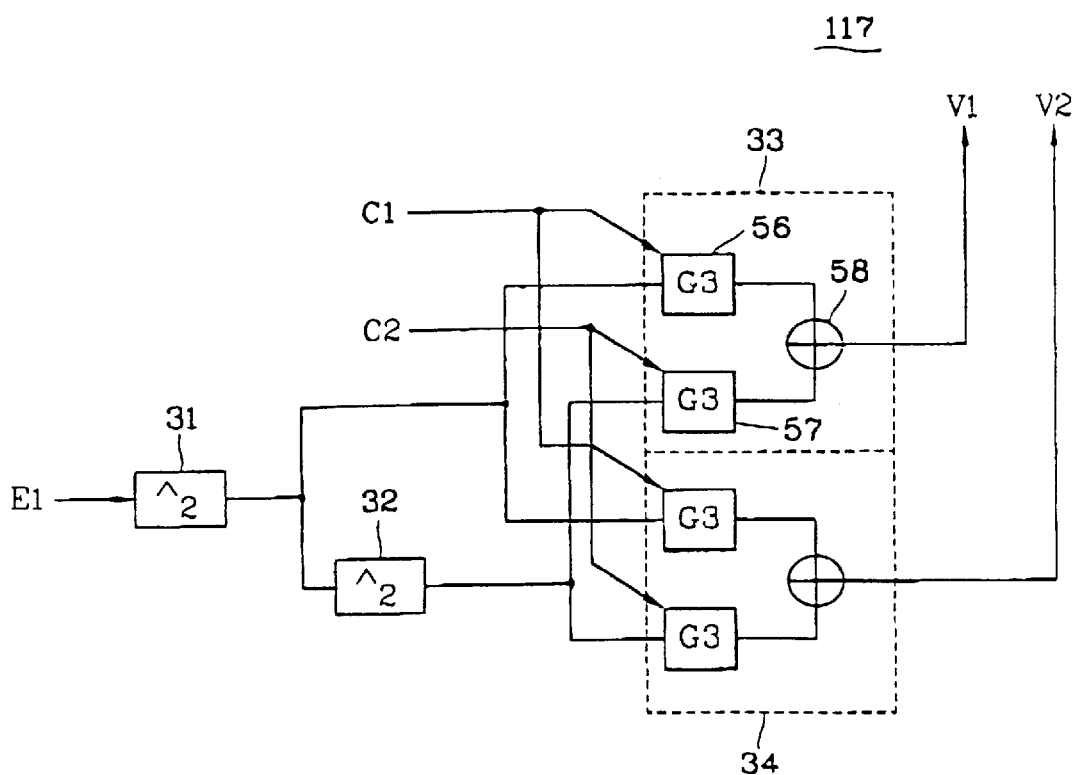
FIG. 4 is a circuit diagram of a work function generator of FIG. 2.

As shown in FIG. 4, the work function generator 117 preferably includes a first square unit 31, which squares the first envelope signal E1 outputted from the first envelope detector circuit 114, a second square unit 32, which squares an output of the first square unit 31, and first and second control voltage generators 33, 34. The first control voltage generates the first control voltage V1 based on the output of the first and the second square units 31, 32 and the tally signals C1, C2 of the DSP so as to control a gain distortion. The second control voltage generator 34 generates the second control voltage V2 based on the output of the first and second square units 31, 32 and the tally signals C1, C2 of the DSP 116 so as to control a phase distortion.

The first and second control voltage generators 33, 34 each preferably has a first multiplier 56, which multiplies an output of the first square unit 31 by the first tally C1, a second multiplier 57, which multiplies output of the second square unit 32 by the second tally C2, and an adder 58, which adds output of the first and the second multiplier 56, 57.

An operation of the predistortion linearizer for the power amplifier of the preferred embodiment will now be described with reference to the accompanying drawings.

Initially, it should be noted that a distortion signal due to nonlinearity of the power amplifier is typically generated by third and fifth elements of the power amplifier. In other words, when an input signal is y and y=x, the output of the power amplifier is $p=x+bx^3+cx^5$, and $bx^3+cx^5$ generates the distortion signal.

Accordingly, if the distortion signal of the third and fifth elements having an opposite value, namely, $-bx^2-cx^5$ is generated using a predistortion circuit and is then inputted to the power amplifier 112, a compensated output signal p, free of distortion, is generated by the power amplifier 112.

The work function generator 117 generates the negative distortion signal $-bx^2-cx^4$ of the second and fourth elements.

Referring to FIG. 4, when the envelope signal E1 is X, and X=1+jQ, the output of the first square unit 31 is $x^2$, and output of the second square unit 32 is $x^4$.

Accordingly, when the output of the first and second square units passes through the first and second control voltage generators 33, 34, V1 and V2 are $C1x^2+C2x^4$. After that, the vector modulator 111 multiplies input signal y=x by distortion signal $-bx^2-cx^4$ generated by the work function generator 117, and the negative distortion signal having third and fifth elements $-bx^3-cx^5$ is generated.

The DSP 116 determines the tally signals b, c of the distortion signal $-bx^2-cx^4$. The subtracter 20 of the DSP 116 subtracts the envelope signals E1, E2 and outputs error value. Thus, when the envelope signal E1 is x, and x=1+jQ, the conjugator 21 conjugates the envelope signal E1=x=1+jQ, its result is 1−jQ, and the multiplier 22 multiplies the error value by 1−jQ.

The output of the multiplier 22 is then reversed by the inverter 23 (−1+jQ), and the integrator 24 outputs the tally signals C1, C2 by integrating the output of the inverter 23.

Thus, non-linear characteristics of the power amplifier 112 are measured accurately, and distortion elements of third and fifth are detected. When the distortion elements are detected, tally signals b, c of second and fourth elements of the work function generator 117 are determined using the DSP 116.

Accordingly, the vector modulator 111 controls gain distortion and phase distortion in accordance with control voltage V1, V2 of the work function generator 117, and generates a pre-distortion signal.

When nonlinear characteristics of the power amplifier change in accordance with time and external circumstances (for example, temperature, noise, or others), predistortion characteristics of the input signal have to be changed to ensure linearity of the power amplifier 112.

When nonlinear character of the power amplifier 112 changes in accordance with time and external circumstances, the DSP 116 compares the envelope signals E1, E2 of the input and output signal detected on the first and the second envelope detector circuits 114, 115, and adjusts tally values b, c of the second and fourth elements, respectively, using the work function generator 117.

The predistortion linearizer as broadly described herein has many advantages. For example, although a characteristic of the power amplifier changes in accordance with temperature, noise, or input voltage, the linearity of the power amplifier is maintained.

Additionally, the adjustment operation is performed more quickly and accurately using the DSP.

Additionally, the predistortion linearizer of the power amplifier of the preferred embodiment generates a distortion signal that is the inverse of a distortion element of an output signal using the work function generator, and the DSP adjusts a tally of the work function by comparing the envelope of the input and output signals.

Accordingly, the predistortion linearizer of the power amplifier of the preferred embodiment is capable of improving nonlinearity of the power amplifier, and in particular, compensates for external circumstances and performs more accurately by implementing the DSP.

The predistortion linearizer of the power amplifier of the present invention is thus capable of maintaining linearity of the power amplifier when nonlinear characteristics of the power amplifier change in accordance with time or external circumstances, such as temperature or noise.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A predistortion linearizer for a power amplifier, comprising:
    first and second envelope detector circuits configured to detect an envelope of first and second signals, respectively;
    a digital signal processor (DSP) coupled to compare output signals of the first and second envelope detector circuits to adjust a tally of a work function;
    a work function generator coupled to receive the output signal of the first envelope detector circuit and the work function tally received from the DSP to generate a work function and output at least one control voltage; and
    a vector modulator configured to distort the first signal in accordance with the at least one control voltage received from the work function generator and output a distortion compensation signal to a power amplifier.

2. The predistortion linearizer of claim 1, wherein the distortion compensation signal comprises third and fifth elements of $-bx^3-cx^5$.

3. The predistortion linearizer of claim 1, wherein the work function comprises a signal equal to $bx^2+cx^4$.

4. The predistortion linearizer of claim 1, wherein the first envelope detector circuit comprises a directional coupler configured to sample a portion of the first signal, a delay unit configured to delay the sampled first signal for a prescribed period of time, an envelope detector configured to detect an envelope of the delayed first signal, and a filter configured to pass only a prescribed frequency of the detected envelope as the output signal.

5. The predistortion linearizer of claim 4, wherein the first signal is an input signal to be amplified, and the filter comprises a low-pass filter.

6. The predistortion linearizer or claim 1, wherein the second envelope detector circuit comprises a directional coupler configured to sample a portion of the second signal, a variable attenuator configured to adjust an amplitude of the sampled second signal, an envelope detector configured to detect an envelope of the adjusted second signal, and a filter configured to pass only a prescribed frequency of the detected envelope as the output signal.

7. The predistortion linearizer of claim 6, wherein the second signal is an output signal of the power amplifier and the filter comprises a low-pass filter, and wherein the variable attenuator adjusts the amplitude of the second signal to match an amplitude of the first signal.

8. The predistortion linearizer of claim 1, wherein the DSP comprises a subtracter configured to subtract output signals of the first and second envelope detector circuits, a conjugator configured to change a sign of an imaginary component of the output signal of the first envelope detector, a multiplier coupled to multiply an output of the subtracter by an output of the conjugator, an inverter coupled to invert an output signal of the multiplier, and an integrator coupled to integrate an output of the inverter.

9. The predistortion linearizer of claim 1, wherein the work function generator comprises a first squaring circuit configured to square the output signal of the first envelope detector, a second squaring circuit, coupled to square an output of the first squaring circuit, a first control voltage generator configured to generate a first control voltage based on outputs of the first and second squaring circuits and the tally received from the DSP, and a second control voltage generator configured to generate a second control voltage based on outputs of the first and second squaring circuits and the tally received from the DSP.

10. The predistortion linearizer of claim 9, wherein the first control voltage controls a gain distortion and the second control voltage controls a phase distortion.

11. The predistortion linearizer of claim 9, wherein the first and second control voltage generator comprise a first multiplier configured to multiply the output of the first squaring circuit unit by the tally, a second multiplier configured to multiply the output of the second squaring unit by the tally, and an adder configured to add outputs of the first and second multiplier.

12. The predistortion linearizer of claim 1, wherein the first signal is an input signal to be amplified and the second signal is an output signal from the power amplifier.

13. A predistortion linearizer for a power amplifier, comprising:
   first and second envelope detectors configured to detect an envelope of an input signal and an output signal, respectively;
   a digital signal processor (DSP) coupled to receive an output of the first and second envelope detectors, adjust a tally of a work function by comparing the output signals, and generate the work function using an output of the first envelope detector and the work function tally to output a gain control voltage and a phase control voltage; and
   a vector modulator coupled to receive the gain and phase control voltages and distort the input signal in accordance with the gain and phase control voltages to output a distortion compensation signal to a power amplifier.

14. The predistortion linearizer of claim 13, wherein the DSP comprises a first squaring circuit coupled to square the output of the first envelope detector, a second squaring circuit coupled to square an output of the first squaring circuit, a first control voltage generator coupled to receive outputs of the first and second squaring circuits and the work function tally to generate the gain control voltage, and a second control voltage generator coupled to receive outputs of the first and second squaring circuits and the work function tally to generate the phase control voltage.

15. The predistortion linearizer of claim 14, wherein the distortion compensation signal comprises a signal having third and fifth elements of $-bx^3-cx^5$.

16. The predistortion linearizer of claim 14, wherein the work function WF is represented by the equation $WF=bx^2+cx^4$.

17. The predistortion linearizer of claim 14, wherein the first envelope detector comprises a directional coupler, which samples the input signal, a delay circuit, which delays the input signal for a prescribed period of time, an envelope detection device, which detects the envelope of the delayed input signal, and a low-pass filter, which passes a low frequency component of the output of the envelope detector.

18. The predistortion linearizer of claim 14, wherein the second envelope detector comprises a directional coupler, which samples the output signal, a variable attenuator, which adjusts an amplitude of the sampled output signal to equal an amplitude of the input signal, an envelope detection device, which detects the envelope of the adjusted output signal, and an low-pass filter, which passes a low frequency component of the output of the envelope detector.

19. The predistortion linearizer of claim 14, wherein the DSP further comprises a subtracter, which subtracts envelope signals detected by the first and second envelope detectors, a conjugator, which changes a sign of an imaginary component of the envelope signal detected by the first envelope detector, a multiplier, which multiplies an output of the subtracter by an output of the conjugator, an inverter, which inverts an output signal of the multiplier, and an integrator, which integrates an output of the inverter to provide the work function tally.

20. A predistortion linearizer for a power amplifier, comprising:
   a first squaring circuit, which squares a first envelope signal;
   a second squaring circuit, which squares an output of the first squaring circuit;
   a first control voltage generator, which generates a first control voltage based on an output of the first squaring circuit, an output of the second squaring circuit, and a tally signal;
   a second control voltage generator, which generates a second control voltage based on the output of the first squaring circuit, the output of the second squaring circuit, and the tally signal; and
   a vector modulator, which distorts an input signal in accordance with the first and second control voltages to provide a distortion signal as an input to a power amplifier.

21. The predistortion linearizer of claim 20, wherein the distortion compensation signal comprises third and fifth order elements of $-bx^3-cx^5$.

22. The predistortion linearizer of claim 21, wherein the first and second control voltage generators each comprise a first multiplier to multiply the output of the first squaring circuit by the tally signal, a second multiplier to multiply the output of the second squaring circuit by the tally signal, and an adder to add outputs of the first and second multipliers.

23. The predistortion linearizer of claim 20, further comprising a digital signal processor (DSP), which adjusts a tally of a work function by comparing the first envelope signal to a second envelope signal, and outputs the tally signal.

24. The predistortion linearizer of claim 23, wherein the DSP comprises a subtracter to subtract the first envelope signal from the second envelope signal, a conjugator to reverses a sign of an imaginary part of the first envelope signal, a multiplier to multiply an output of the subtracter by an output of the conjugator, an inverter to reverse an output signal of the multiplier, and an integrator to integrate an output of the inverter.

25. The predistortion linearizer of claim 24, wherein the first envelope signal is an envelope of a signal to be amplified by the power amplifier, and the second envelope signal is an envelope of an output signal of the power amplifier.

26. The predistortion linearizer of claim 20, further comprising:
   a first envelope detector configured to detect an envelope of an input signal and output the first envelope signal;
   a second envelope detector configured to detect an envelope of an output signal of the power amplifier and output the second envelope signal; and
   a digital signal processor, configured to receive the first and second envelope signals to generate the tally signal.

27. The predistortion linearizer of claim 26, wherein the input signal is a signal to be amplified by the power amplifier, and the output signal is an amplified input signal.

28. The predistortion linearizer of claim 20, wherein the first control voltage controls a gain distortion of the power amplifier, and the second control voltage controls a phase distortion of the power amplifier.

29. The predistortion linearizer of claim 20, wherein the tally signal comprises an integrated inverse signal, wherein the inverse signal comprises a negative of a product of a difference of the first envelope signal minus the second envelope signal multiplied by a conjugated first envelope signal.

30. A method of generating a predistortion signal for a power amplifier, comprising:

detecting an envelope of first and second signals;

comparing a first detected envelope with a second detected envelope to generate a tally of a work function;

generating a work function using the output of the first envelope detector and the work function tally;

generating first and second control voltages in accordance with the work function;

distorting the first signal by vector modulating the first signal with the first and second control voltages.

31. The method of claim 30, wherein the first control voltage controls a gain distortion of the power amplifier, and wherein the second control voltage controls a phase distortion of the power amplifier.

32. The method of claim 30, wherein the first signal is an input signal to be amplified by the power amplifier, and wherein the second signal is an amplified input signal.

\* \* \* \* \*